United States Patent
Fragapane et al.

(10) Patent No.: US 7,091,559 B2
(45) Date of Patent: Aug. 15, 2006

(54) JUNCTION ELECTRONIC COMPONENT AND AN INTEGRATED POWER DEVICE INCORPORATING SAID COMPONENT

(75) Inventors: Leonardo Fragapane, Catania (IT); Antonino Alessandria, Catania (IT)

(73) Assignee: STMicroelectronics S.r.l., (IT)

(*) Notice: Subject to any disclaimer, the term of this patent is extended or adjusted under 35 U.S.C. 154(b) by 0 days.

(21) Appl. No.: 10/817,742

(22) Filed: Apr. 1, 2004

(65) Prior Publication Data

US 2004/0262684 A1 Dec. 30, 2004

(30) Foreign Application Priority Data

Apr. 18, 2003 (EP) .................. 03425242

(51) Int. Cl.
*H01L 29/72* (2006.01)
(52) U.S. Cl. .................. 257/341; 257/342; 257/365
(58) Field of Classification Search ............... 257/341, 257/365, 342, 339, 327, 328
See application file for complete search history.

(56) References Cited

U.S. PATENT DOCUMENTS 3,171,042 A  2/1965 Matare ............... 307/88.5

6,268,628 B1 * 7/2001 Yoshida et al. ............. 257/341

FOREIGN PATENT DOCUMENTS

| EP | 1028511 A2 | 8/2000 |
|---|---|---|
| EP | 1189286 A1 | 3/2002 |
| JP | 62199051 | 9/1987 |
| JP | 63050070 | 3/1988 |
| JP | 2002246598 | 8/2002 |

OTHER PUBLICATIONS

European Search Report, 03425242.9, Oct. 27, 2003.

* cited by examiner

*Primary Examiner*—Edward Wojciechowicz
(74) *Attorney, Agent, or Firm*—Lisa K. Jorgenson; Graybeal Jackson Haley; Paul F. Rusyn

(57) ABSTRACT

A junction device including at least a first type semiconductor region and a second type semiconductor region a, which are arranged contiguous to one another and have a first and, respectively, a second type of conductivity, which are opposite to one another, and a first and a second biasing region (; the device is moreover provided with a resistive region, which has the first type of conductivity and extends from the first type semiconductor region and is contiguous to the second type semiconductor region so as to form a resistive path between the first and the second biasing regions.

26 Claims, 5 Drawing Sheets

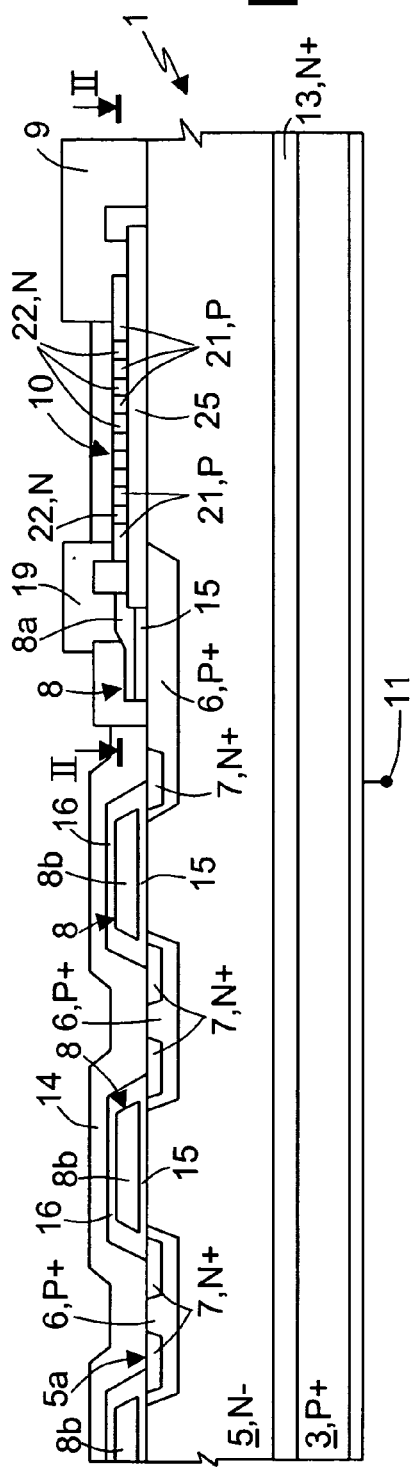
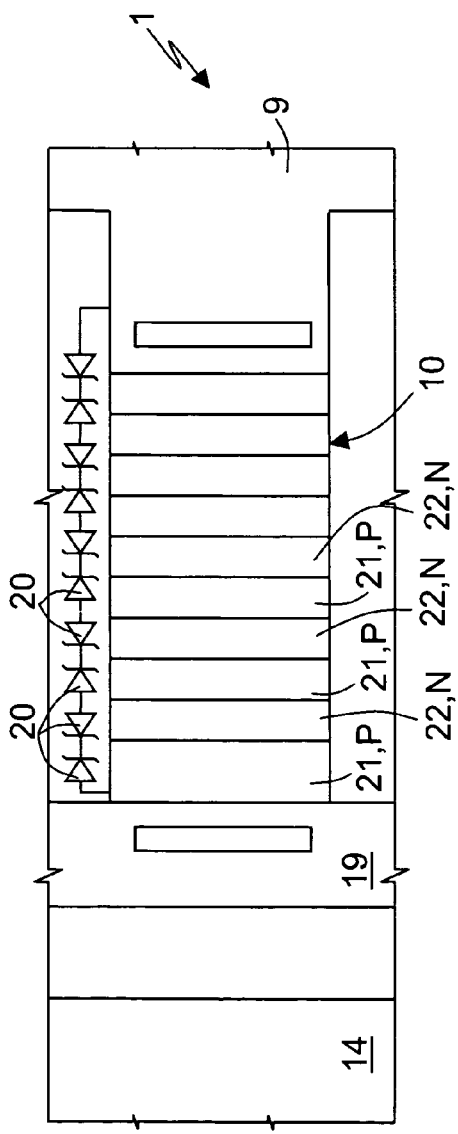

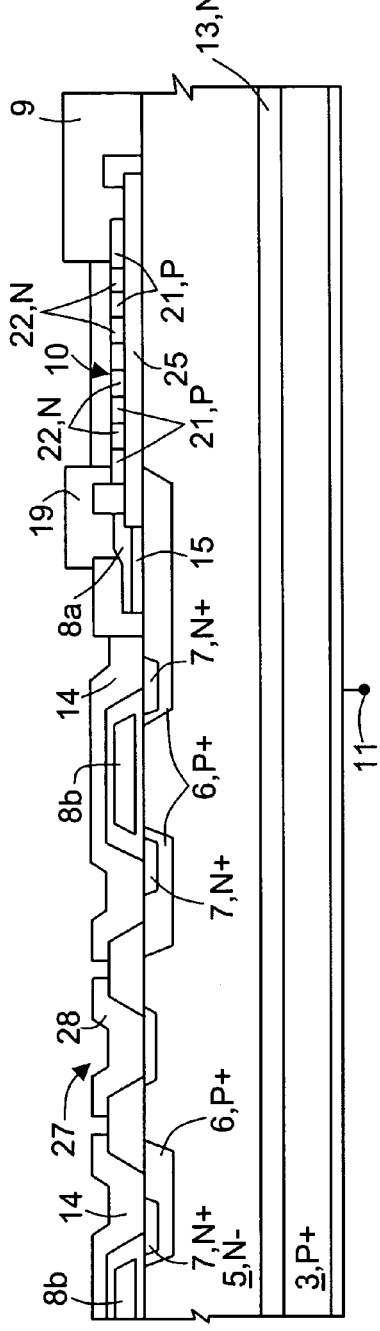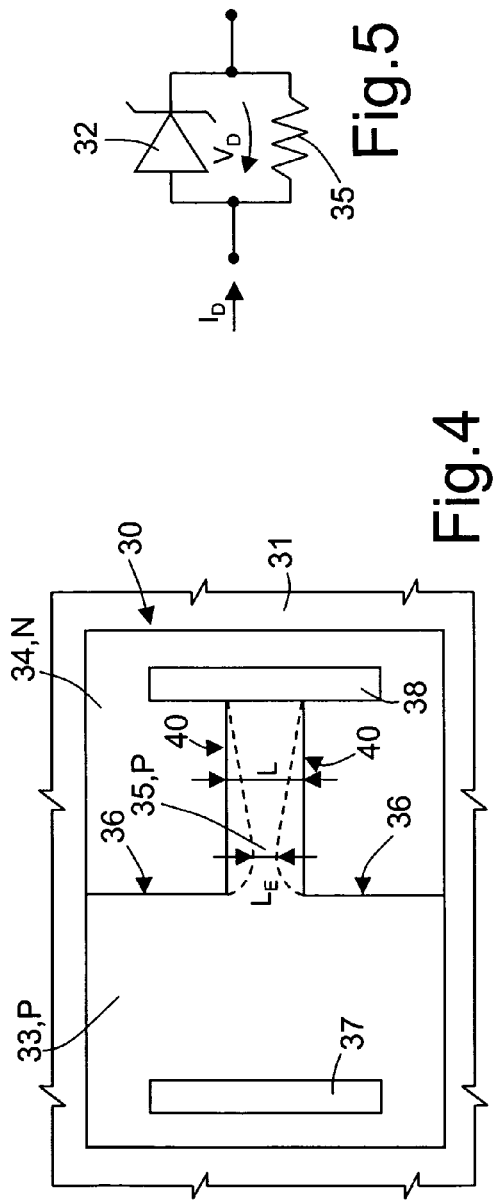

JUNCTION ELECTRONIC COMPONENT AND AN INTEGRATED POWER DEVICE INCORPORATING SAID COMPONENT

PRIORITY CLAIM

This application claims priority from European patent application No. 03425242.9, filed Apr. 18, 2003, which is incorporated herein by reference.

TECHNICAL FIELD

The present invention relates to a junction electronic component and to an integrated power device incorporating said component.

BACKGROUND

As is known, integrated power devices designed to withstand voltages of several hundreds of volts, such as for example insulated-gate bipolar transistors (IGBTs) or power-MOS transistors, are normally controlled by driver devices which, among other things, operate to prevent overvoltages or undesirable oscillations on the high-voltage terminals, which may cause serious problems.

For example, in the case of electronic-ignition equipment used for sparking combustion in internal-combustion engines, IGBTs are normally used as power switches for supplying the primary windings of the high-voltage transformers. In greater detail, upon switching-on of the power switches, the primary winding of one of the high-voltage transformers is supplied with a constant battery voltage and hence is traversed by a current which increases in time. A clamp circuit intervenes to limit said current when the energy stored in the primary winding is sufficient to cause a spark between the electrodes of a spark-plug connected to the secondary winding of the same transformer. The opening of the circuit by the power switch causes a voltage peak (normally comprised between 400 V and 600 V), which, amplified by the transformation ratio of the transformer, causes the spark. In the example described, the voltage on the collector of the IGBT (high-voltage terminal) must be controlled both upon switching-off of the IGBT itself, to prevent any possible breakdown, and when the limiting circuit intervenes; in the absence of control, in fact, so large oscillations may occur as to cause undesirable sparks.

Clearly, in order to be able to carry out the control, it is necessary to supply the driver device associated to the power device with a signal representing the voltage present on the high-voltage terminal (the collector terminal, in the case of IGBTs); on the basis of this signal, the driving device acts on a control terminal of the power device.

For this purpose, a known technique is to integrate a high-voltage sensor within the power device. In particular, two solutions have been proposed, which will be briefly described as follows.

A first solution is illustrated in FIG. 1, which shows an IGBT 1 made in a semiconductor body and comprising a collector region 3, a conduction region 5, body regions 6, emitter regions 7, a gate region 8, an equipotential region 9, and a protection circuit 10.

The collector region 3 is formed in a substrate of the body 2, here of P+ type, and has a face coated with a metal layer forming a collector contact 11. The conduction region 5, which is of N− type, extends above the collector region 3 and is separated therefrom by a junction layer 13, of N+ type. Furthermore, the collector region 3 and the conduction region 5 are high-voltage regions.

The body regions 6, of P+ type, are housed in the conduction region 5 and emerge on a surface 5a of the conduction region itself. In turn, the body regions 6 house the emitter regions 7, which are of an N+ type and which are also substantially flush with the surface 5a. Preferably, all of the emitter regions 7 are connected to a single emitter contact 14.

The gate region 8, which is made of polysilicon, is insulated from the conduction region 5 by means of a thin layer of gate oxide 15, and from the emitter contact 14 by means of an insulating layer 16. Furthermore, the gate region 8 comprises a first portion 8a, provided with a gate contact 19, and second biasing portions 8b (the first and the second portions 8a, 8b are connected together; however, the connection is not visible in the cross-sectional view of FIG. 1). The second portions 8b of the gate region 8 extend between adjacent body regions 6 and partially overlap the emitter regions 7.

The equipotential region 9, which is normally metallic, is in direct electrical connection with the conduction region 5 and extends on its surface 5a around the IGBT 1. The voltage of the conduction region 5 and of the equipotential region 9 differ from the voltage of the collector region 3 only by the forward voltage present on the PN junction formed by the collector region 3 and by the junction region 13. For this reason, the equipotential region 9 is used as a sensor for detection of the collector voltage.

The protection device 10 is connected to the gate contact 19 and to the equipotential region 9 and comprises a cascade of Zener diodes 20 connected in pairs in back-to-back configuration, i.e., having cathode terminals in common. In practice, the Zener diodes are formed by means of first and second strips 21, 22 of polysilicon, which are contiguous and have alternated P type and N type conductivity (see FIG. 2). More precisely, each first strip 21, having for example P type conductivity, is contiguous to two second strips 22 having N type conductivity; instead, each second strip 22 is contiguous to two first strips 21. The Zener diodes 20 are formed by the junctions 23 between adjacent strips 21, 22. Consequently, each first strip 21, having P type conductivity, constitutes a common anode terminal of two adjacent Zener diodes 20; likewise, each second strip 22, having N type conductivity, constitutes a common cathode terminal of two adjacent Zener diodes 20. The protection device 10 is moreover made on a thick field-oxide region 25 and hence is electrically connected to the conduction region 5 only through the equipotential region 9. In practice, the protection device 10 limits the voltage between the gate region 8 and the equipotential region 9 to a maximum value equal to the sum of the reverse breakdown voltages of the equi-oriented Zener diodes 20 (i.e., half of the total number of the Zener diodes 20).

The solution described has, however, certain limits, principally in that the terminal used as high-voltage sensor, i.e., the equipotential region 9, is in turn a high-voltage terminal and hence can be connected only to control devices capable of withstanding and processing voltages of several hundreds of volts.

A different solution, illustrated in FIG. 3, where parts that are the same as the ones already illustrated bear the same reference numbers, envisages the use, as a voltage sensor, of a junction field-effect transistor (JFET) 27, operating as a high-voltage nonlinear resistor. In greater detail, the JFET 27 has an emitter contact 28, formed on a portion 5a of the conduction region 5, which is delimited laterally by two body regions 6. In addition, the body regions 6 and the conduction region 5 are used as gate regions and, respectively, as drain region of the JFET 27, while the emitter contact 14 functions also as gate contact. In practice, the current flowing through the JFET 27 is modulated by the voltage present between the conduction region 5 and the emitter contact 14.

In this case, then, the output of the voltage sensor is advantageously a current, which can be easily converted into a low-voltage signal. However, the presence of a transistor within the conduction region 5 introduces active parasitic components, with consequent problems as regards possible undesired activations (latch-up) and tends to modify the behavior of the power device. Furthermore, the overall dimensions increase.

SUMMARY

An aspect of the present invention is to provide a junction electronic component which can be used as a high-voltage sensor, and an integrated power device incorporating said junction electronic component, which are free from the drawbacks described.

According to aspects of the present invention, there are a junction electronic component and a high-power integrated device incorporating said junction electronic component as claimed in claim 1 and claim 10, respectively.

BRIEF DESCRIPTION OF THE DRAWINGS

For a better understanding of the invention, a number of embodiments are now described, which are provided purely by way of non-limiting example with reference to the attached drawings, in which:

FIG. 1 is a cross-sectional view through a first known integrated power device;

FIG. 2 is a top plan view of the device of FIG. 1, sectioned along the line II—II of FIG. 1 and at an enlarged scale;

FIG. 3 is a cross-sectional view through a second known integrated power device;

FIG. 4 is a top plan view of a junction electronic component according to a first embodiment of the present invention;

FIG. 5 is an equivalent electrical diagram of the electronic component of FIG. 4;

DETAILED DESCRIPTION

Figure 6:
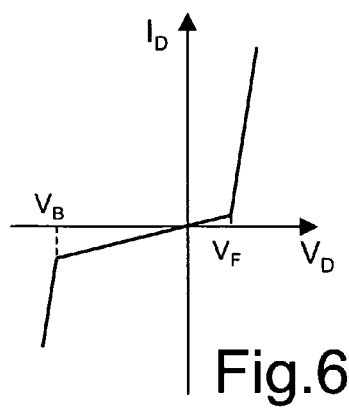
FIG. 6 is a graph which illustrates an electrical characteristic of the electronic component of FIG. 4.

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

With reference to FIG. 4, a junction electronic component is designated by the number 30, which is integrated in a semiconductor body 31, for example made of silicon, and comprises a Zener diode 32 and an integrated resistive region 35. The Zener diode 32 comprises an anode region 33, having conductivity of P type, and a cathode region 34, contiguous to the anode region 33 and having conductivity of N type. The anode and cathode regions 33, 34 have respective pre-determined doping levels and form a PN junction 36, which has a forward conduction voltage $V_F$ of approximately 0.7 V and a reverse breakdown voltage $V_B$ correlated to the doping levels. For example, with doping levels of $4*10^{18}$ atoms/cm$_3$ for the anode region 33 and $2*10^{19}$ atoms/cm$^3$ for the cathode region 34, the reverse breakdown voltage $V_B$ is approximately 7.5 V. The anode and cathode regions 33, 34 are provided with respective metal anode and cathode contacts 37, 38, opposite to the PN junction 36, for electrical connection of the junction component 30 to circuit components (here not illustrated). The junction component 30 may also be made in a polysilicon layer deposited on an insulating layer, such as the field-oxide layer 25 of the power devices illustrated in FIGS. 1 and 3. In this case, the anode regions 33 and the cathode regions 34 have the same thickness as the polysilicon layer in which the junction component 30 is formed. In practice, the anode regions 33 and the cathode regions 34 extend between a front surface and a back surface of the junction component 30. Accordingly, the PN junction 36 extends across the whole thickness of the junction component 30.

The integrated resistive region 35, which is also made of polysilicon, has the same type of conductivity (P) and, preferably, the same level of doping as the anode region 33. Furthermore, the integrated resistive region 35 is shaped like a strip of pre-determined width L, which projects from the anode region 33 in a direction substantially perpendicular to the PN junction 36 and extends through the cathode region 34, as far as underneath the cathode contact 38. In other words, the integrated resistive region 35 and the cathode contact 38 are in direct electrical connection with one another. In this way, in practice, a resistive path connects together the anode and cathode contacts 37.38, in parallel to the PN junction 36 (FIG. 5). Consequently, the junction component 30 has the characteristic illustrated in FIG. 6. In particular, the work current $I_D$ flowing through the junction component 30 depends substantially in a linear way on the work voltage $V_D$ applied between the anode and cathode terminals 37, 38 when said work voltage $V_D$ is comprised between $-|V_B|$ and $V_F$ (in this case, only the integrated resistive region 35 contributes to the conduction of current, while the Zener diode 31 is cut-off); otherwise, the work current $I_D$ is to a fair approximation independent of the work voltage $V_D$, since also the Zener diode 31 conducts.

In effect, the relation between work voltage $V_D$ and work current $I_D$ is not exactly linear even for weak reverse voltages. In fact, also the integrated resistive region 35 and the cathode region 34 are contiguous to one another, and hence PN junctions are formed along the edges 40 of the integrated resistive region 35 itself. In the presence of a current, between the integrated resistive region 35 and the cathode region 34 a reverse voltage is set up which causes partial emptying of the integrated resistive region 35. Consequently, the pre-determined effective width $L_E$ of the integrated resistive region 35 decreases, and its resistivity increases. In other words, the integrated resistive region 35 tends to present the so-called "pinch-off" typical of JFETs.

The junction electronic component according to embodiments of the invention may advantageously be used in all the cases in which it is necessary to provide a controlled passage of current through the anode and cathode terminals of a polysilicon diode. Owing to the integration of the resistive region directly within the diode, the junction component is extremely compact and enables a considerable saving of area. A further advantage is provided in that the resistivity value of the integrated resistive regions is practically independent of the temperature, with the normal doping levels.

Furthermore, the junction component described is particularly suited for modular uses in making pairs of diodes in back-to-back configuration and high-voltage sensors, as illustrated hereinafter.

Figure 7:
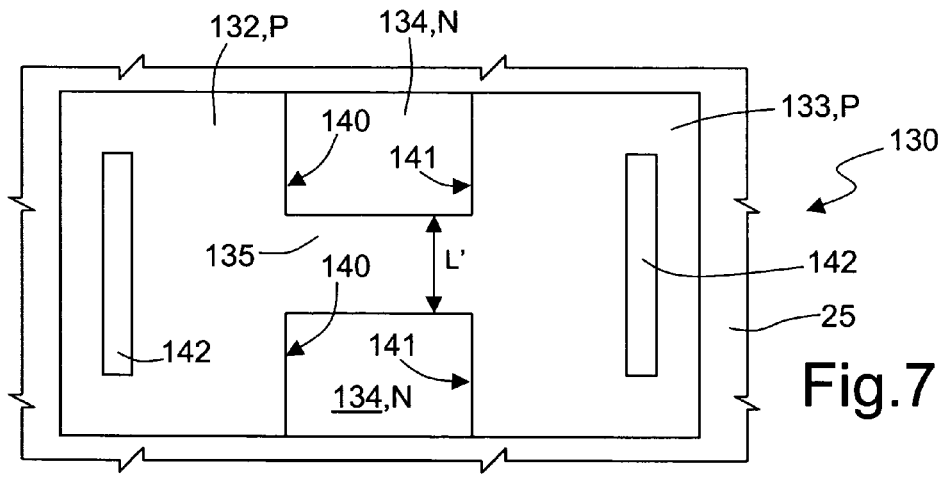
FIG. 7 is a top plan view of an electronic component in a second embodiment of the present invention.

In particular, according to a different embodiment of the invention illustrated in FIG. 7, a junction component 130 comprises: a first anode region 132 and a second anode region 133, both having conductivity of P type; a cathode region 134, contiguous to both of the anode regions 133 and having conductivity of N type; and an integrated resistive region 135, having the same conductivity as the anode regions 133. The first and the second anode regions 132, 133 form, with the cathode region 134, a first Zener diode 137 and a second Zener diode 138 identical to one another and facing in opposite directions (in back-to-back configuration, see FIG. 8). In particular, the first Zener diode 137 comprises a first PN junction 140, defined between the first anode region 132 and the cathode region 134, whereas the second Zener diode 138 comprises a second PN junction 141, defined between the second anode region 133 and the cathode region 134; the cathode region 134 is thus common to the Zener diodes 137, 138. Metal contacts 142 are made at opposite ends of the first and of the second anode regions 132, 133 and hence are opposite to the PN junctions 140, 141. The junction component 130 is preferably made in a polysilicon layer deposited on an insulating layer, such as the field-oxide layer 25 of the power devices illustrated in FIGS. 1 and 3. In this case, the first and second anode regions 132, 133 and the cathode region 134 have the same thickness as the polysilicon layer in which the junction component 130 is formed. In practice, the first and second anode regions 132, 133 and the cathode region 134 extend between a front surface and a back surface of the junction component 130. Accordingly, the PN junctions 140, 141 extend across the whole thickness of the junction component 130.

Figure 8:
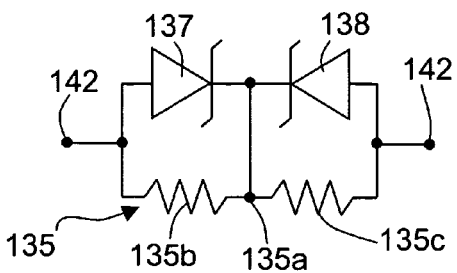
FIG. 8 is an equivalent electrical diagram of the electronic component of FIG. 7.

The integrated resistive region 135 extends between the first and the second anode regions 132, 133 across the cathode region 134 (FIG. 7). In addition, the integrated resistive region 135 is substantially perpendicular to the PN junctions 140, 141, has a pre-determined width L', and is contiguous to the cathode region 134 along its edges 143. Also in this case, the integrated resistive region 135 defines a resistive path parallel to the first Zener diode 137 and to the second Zener diode 138 and connecting the contacts 142 (FIG. 8). In greater detail, given that the voltage varies gradually along the integrated resistive region 135, an intermediate point 135a of the resistive region 135 itself is at the potential of the cathode region 134. Furthermore, a first portion 135b of the integrated resistive region 135, comprised between the intermediate point 135a and the first anode region 132, forms a resistive path parallel to the first Zener diode 137, while a second portion 135c of the integrated resistive region 135, comprised between the intermediate point 135a and the second anode region 133, forms a resistive path parallel to the second Zener diode 138.

Figure 9:
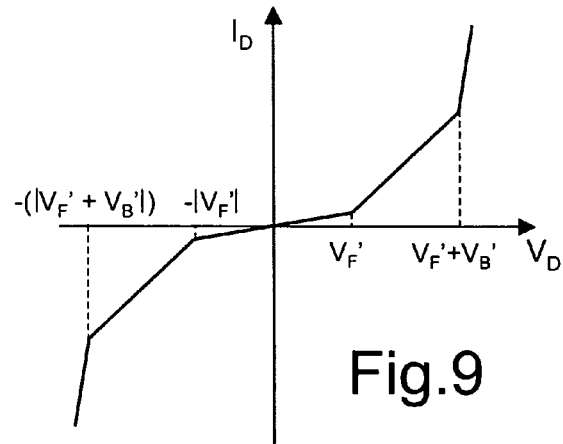
FIG. 9 is a graph which illustrates an electrical characteristic of the electronic component of FIG. 7.

As illustrated in FIG. 9, the characteristic of the junction component 130 is substantially symmetrical. In practice, when the absolute value of the work voltage $V_D'$ is lower than the forward conduction voltage $V_F'$ (approximately 0.7 V) of the Zener diodes 137, 138, the work current $I_D'$ flows between the contacts 142 only through the integrated resistive region 135. Consequently, the work voltage $V_D'$ and the work current $I_D'$ are linked by a substantially linear relation. When the work voltage $V_D'$ is sufficiently high, also the Zener diodes 137, 138 are on. More precisely, designating by $V_B'$ the reverse breakdown voltage (approximately 7.5 V) of the PN junctions 140, 141, when we have:

$$|V_F'|<|V_D'|<|V_B'|+|V_F'|$$

one of the Zener diodes 137, 138 conducts a forward current, whilst the other is inhibited. In this case, the slope of the characteristic of the junction component 130 is determined substantially by the portion 135b, 135c of the integrated resistive region parallel to the inhibited Zener diode 137, 138.

When, instead, we have:

$$|V_D'|>|V_B'|+|V_F'|$$

both of the Zener diodes 137, 138 conduct (in each case, one of the Zener diodes 137, 138 conducts a forward current, and the other conducts a reverse current). In this condition, the contribution of the integrated resistive region 135 is practically negligible.

Figure 10:
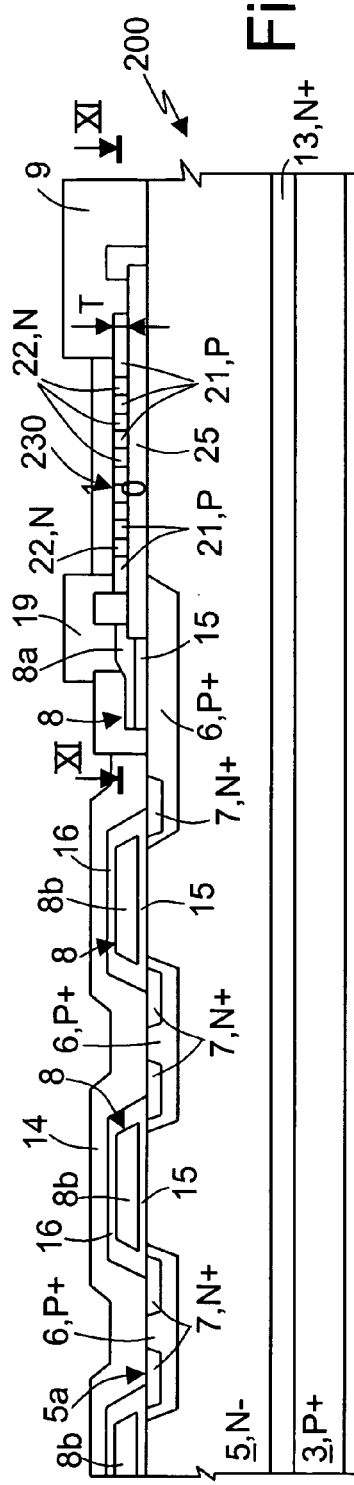
FIG. 10 is a cross-sectional view through an integrated power device incorporating a junction electronic component in a third embodiment of the present invention.
Figure 11:
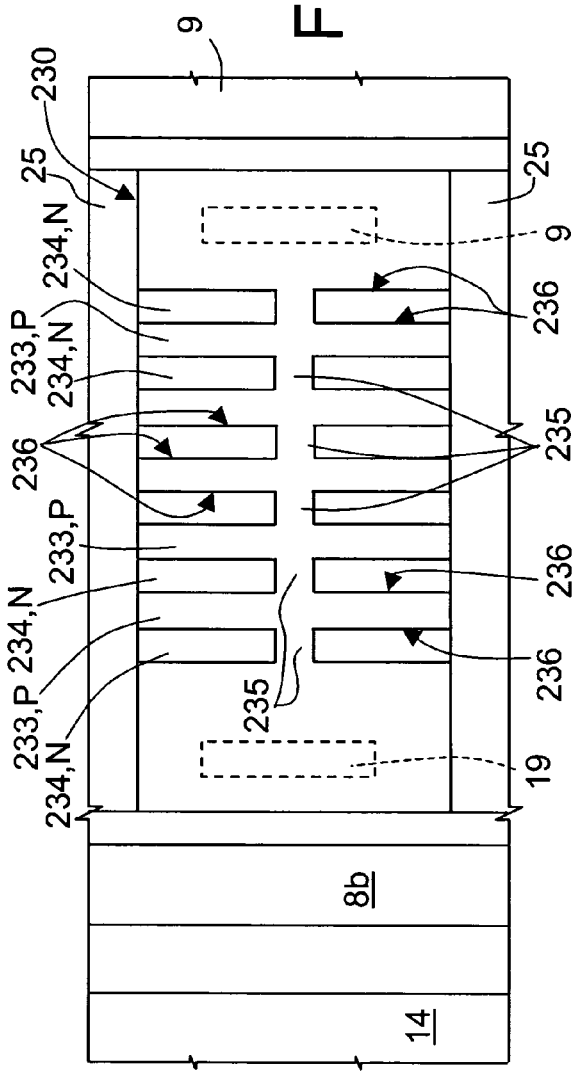
FIG. 11 is a top plan view of the electronic component of FIG. 10, sectioned along the line XI—XI of FIG. 10 and at an enlarged scale.

In FIG. 10, where parts that are the same as the ones already illustrated in FIG. 1 are designated by the same reference numbers, a power device, in particular an IGBT 200, is illustrated, according to a third embodiment of the invention. In detail, the IGBT 200 comprises the collector region 3, the conduction region 5, the body regions 6, the emitter regions 7, the gate region 8 with the gate contact 19, the equipotential region 9, and a junction component 230, which is used as a high-voltage sensor. For this purpose, the junction component 230 is separated from the conduction region 5 by means of the field-oxide layer 25 and is connected between the equipotential region 9 and the gate contact 19. As illustrated in FIG. 11, the junction component 230, made of polycrystalline silicon, comprises: a plurality of anode regions 233 having conductivity of a P type; a plurality of cathode regions 234 having conductivity of an N type; and a plurality of integrated resistive regions 235, here of a P type. In addition, in FIG. 11, the gate contact 19 and the portion of the equipotential region 9 that contacts the junction component 230 are illustrated with a dashed line. The anode regions 233 and the cathode regions 234 are alternate and in contiguous pairs so as to form a plurality of first and second Zener diodes 237, 238, which are identical to one another and comprise respective PN junctions 236. Moreover, the anode regions 233 and the cathode regions 234 have a same thickness T as the junction component 230. In practice, each of the anode regions 233 and of the cathode regions 234 extends between a front surface and a back surface of the junction component 230, as shown in FIG. 10 (the back surface is directly in contact with the field-oxide layer 25 and the front surface is opposite to the back surface; both the front and the back surfaces are horizontal in FIG. 10). Accordingly, the PN junctions 236 are arranged substantially perpendicular to the front surface and the back surface of the junction component 230 (i.e. vertical in FIG. 10) and extend across the whole thickness of the junction component 230. The first Zener diodes 237 are alternated with the second Zener diodes 238 so that a first Zener diode 237 and a second Zener diode 238 adjacent to one another are connected together in back-to-back configuration. In practice, each of the anode regions 233 and of the cathode regions 234 is common to a respective first Zener diode 237 and to a respective second Zener diode 238. It is to be noted that, in the configuration described, each PN junction 236 functions as a biasing region for the adjacent PN junctions 236.

Figure 12:
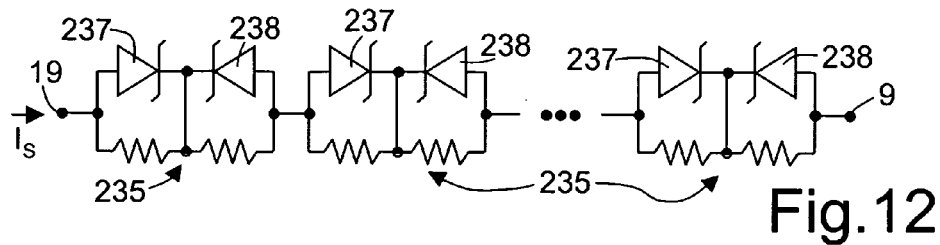
FIG. 12 is an equivalent electrical diagram of the electronic component of FIG. 10.

The integrated resistive regions 235 extend between two successive anode regions 233 perpendicular to the PN junctions 236 and traverse the corresponding cathode region 234. Each integrated resistive region 235 thus forms a resistive path parallel to corresponding first and second Zener diodes 237, 238. Furthermore, the integrated resistive regions 235, which in the embodiment described are aligned, define a resistive path connecting the gate contact 19 and the equipotential region 9; in particular, each integrated resistive region 236 is in parallel to a corresponding PN junction 236 (see also FIG. 12).

Figure 13:
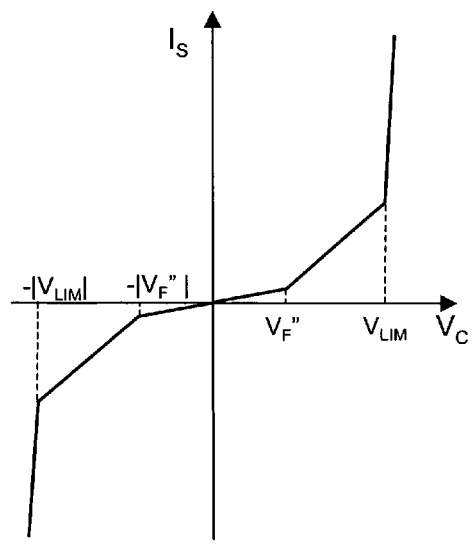
FIG. 13 is a graph which illustrates an electrical characteristic of the electronic component of FIG. 10.

During operation of the IGBT 200, a sensing current $I_S$ flows through the junction component 230 (FIG. 13), and is correlated to the voltage of the conduction region 5 and hence to the collector voltage $V_C$ present on the collector contact 11 (as mentioned previously, in fact, these voltages differ by an amount equal to the forward biasing voltage of a PN junction, i.e., approximately 0.7 V). The sensing current $I_S$ depends in a substantially piecewise-linear way upon the collector voltage $V_C$ (high voltage) when the collector voltage $V_C$ is lower, in absolute value, than a clamp voltage $V_{LIM}$ equal to $N*(|V_F"|+|V_B"|)$, where $V_B"$ is the reverse breakdown voltage of each Zener diode 237, 238 and N is the number of first Zener diodes 237 (or, equivalently, the number of second Zener diodes 238). More precisely, the characteristic of the junction component 230 has a first slope (greater resistance), if:

$$|V_C|<N*|V_F"|$$

and a second slope (smaller resistance), if:

$$N*|V_F"|<|V_C|<V_{LIM}$$

The junction component 230 moreover limits the collector voltage $V_C$ to the clamp voltage $V_{LIM}$; once said voltage has been reached, the sensing current $I_S$ is substantially independent of the collector voltage $V_C$ (the contribution due to the current flowing through the integrated resistive regions 235 is substantially negligible). Clearly, the value of the clamp voltage $V_{LIM}$ depends upon the number N of first Zener diodes 237 or of second Zener diodes 238 present and is normally comprised between 400 V and 600 V. Hence, the junction component 230 is also suitable to be used as a high voltage clamp.

The sensing current $I_S$ is supplied to the gate contact and can be conveniently taken and converted into a low-voltage signal indicative of the collector voltage $V_C$ (high voltage). Consequently, it is advantageously possible to associate to the IGBT 200 standard control circuits, and it is not necessary to provide devices capable of processing high voltages. The junction component 230 does not introduce parasitic structures into the IGBT 200, as it is made of polysilicon above a thick oxide layer (field oxide) outside of the active area. Furthermore, the clamp voltage $V_{LIM}$ of the junction component 230 may be conveniently controlled by selecting an appropriate number of Zener diodes. Another advantage is that the integrated resistive regions 235 may be used as intermediate sensing points since the voltage varies gradually along the resistive path between the equipotential region 9 and the gate contact 19.

Figure 14:
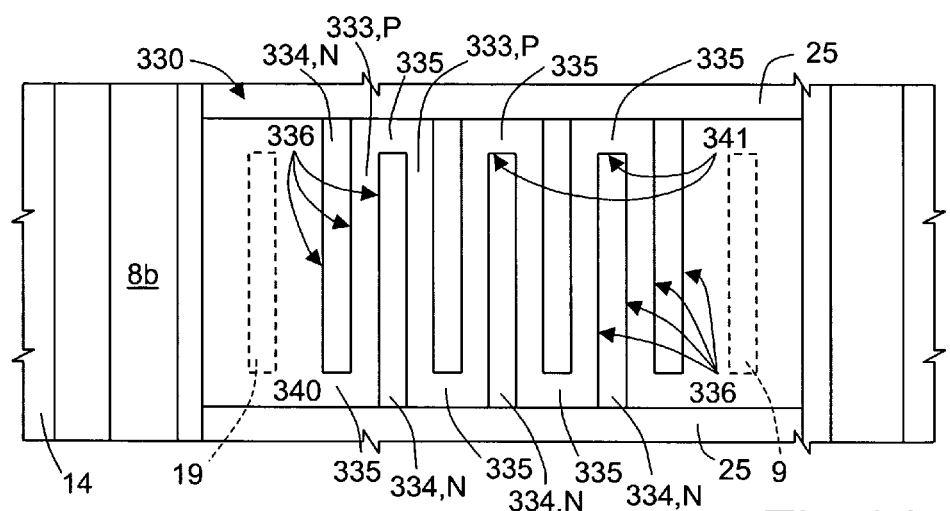
FIG. 14 is a top plan view, partially sectioned and at an enlarged scale, of a junction electronic component in a fourth embodiment of the present invention.
Figure 15:
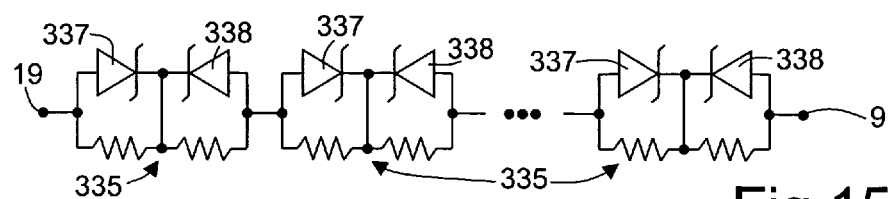
FIG. 15 is an equivalent electrical diagram of the electronic component of FIG. 14.

A fourth embodiment of the invention is illustrated in FIG. 14. In this case, a junction component 330, made of polycrystalline silicon, comprises anode regions 333, having conductivity of a P type, cathode regions 334, having conductivity of a N type, and integrated resistive regions 335. As in the case of the junction component 230 of FIGS. 11 and 12, the junction component 330 is connected between the equipotential region 9 and the gate contact 19 of an IGBT (here not illustrated). Furthermore, the anode region 333 and cathode region 334 are alternated and contiguous in pairs so as to form first and second Zener diodes 337, 338 comprising respective PN junctions 336. Each of the anode and cathode regions 333, 334 is common to a pair of adjacent first and second Zener diodes 337, 338, which are connected in back-to-back configuration (FIG. 15). Moreover, the anode regions 333 and the cathode regions 334 have the same thickness as the junction component 330. In practice, each of the anode regions 333 and of the cathode regions 334 extends between a front surface and a back surface of the junction component 330 (the back surface is directly in contact with the field-oxide layer 25 and the front surface is opposite to the back surface). Accordingly, the PN junctions 336 are arranged substantially perpendicular to the front surface and the back surface of the junction component 330 and extend across the whole thickness of the junction component 330.

The integrated resistive regions 335, which are of a P type, extend between consecutive anode regions 333 in a direction substantially perpendicular to the PN junctions 336. In this case, the integrated resistive regions 336 are staggered with respect to one another and, preferably, are arranged alongside the corresponding cathode regions 334 alternately along first and second opposite edges 340, 341 of the cathode regions 334 themselves. Consequently, the integrated resistive regions 335 are contiguous to the corresponding cathode regions 334 on just one side, and a serpentine resistive path is formed, which connects the equipotential region 9 and the gate contact 19 and also includes the anode regions 333. Furthermore, each integrated resistive region 335 is in parallel with the corresponding PN junction 336.

The greater length of the serpentine resistive path represents a further advantage of the junction component 330: in fact, the overall resistance in parallel to the Zener diodes 337, 338 is increased, given the same area occupied. Also the junction component 330 is suitable to be used as a high voltage clamp.

Finally, it is evident that modifications and variations may be made to the component described herein, without departing from the scope of the present invention.

In particular, the integrated resistive regions could have a different conformation with respect to what has been described above (for example, the ratio between the width and the length could be different). Furthermore, the integrated resistive regions could have the same type of conductivity as the cathode regions and extend from the cathode regions through the anode regions. In both cases, however, the doping level of the integrated resistive regions could be different from the doping levels both of the anode regions and of the cathode regions (for this purpose, the fabrication of the junction component could envisage implantation and possibly masking steps specifically for doping the integrated resistive regions).

The junction components 30, 130, 230, and 330 according to the described embodiments may be utilized in various types of MOS devices, such as the described IGBTs. Moreover, such devices may be contained in a variety of different types of electronic systems, such as in electronic ignition systems for internal-combustion engines and in other types of high voltage control systems.

From the foregoing it will be appreciated that, although specific embodiments of the invention have been described herein for purposes of illustration, various modifications may be made without deviating from the spirit and scope of the invention.

The invention claimed is:

1. A junction electronic component comprising:
    at least a first type semiconductor region and a second type semiconductor region, which have a first and, respectively, a second type of conductivity, opposite to the first type of conductivity and are arranged contiguous to one another so as to form a PN junction;
    wherein the junction electronic component has a first surface, a second surface opposite to said first surface, and a thickness, and wherein said first type semiconductor region and said second type semiconductor region extend between said first surface and said second surface and said PN junction extends across the whole thickness of the junction electronic component;
    a first biasing contact region contacting the first type semiconductor region and adapted to receive a biasing voltage to be applied to the first type semiconductor region;
    a second biasing region contacting the second type semiconductor region and adapted to receive a second biasing voltage to be applied to the second type semiconductor region;
    wherein the junction electronic further comprises at least one resistive region, which has said first type of conductivity and extends from said first type semiconductor region contiguous to said second type semiconductor region so as to form a resistive path between said first and second biasing regions in parallel to said PN junction.

2. The component according to claim 1, wherein said resistive region extends through said second type semiconductor region.

3. The component according to claim 1, wherein said resistive region is set alongside and bordering upon a side with said second type semiconductor region.

4. The component according to claim 1, wherein said resistive region is a semiconductor strip of pre-determined width.

5. The component according to claim 1, wherein said first and second biasing regions are arranged on said first type semiconductor region and, respectively, on said second type semiconductor region, and in that said resistive region extends from said first type semiconductor region to said second biasing region.

6. The component according to claim 1, further comprising at least two first type semiconductor regions separate from said second type semiconductor region so as to form a first diode and a second diode having a terminal in common.

7. The component according to claim 6, wherein said resistive region extends between said first type semiconductor regions.

8. The component according to claim 1, comprising a plurality of first type semiconductor regions and a plurality of second type semiconductor regions, arranged alternately and in contiguous pairs, so as to form a plurality of first and second diodes, and in that adjacent pairs of first and second diodes have a respective terminal in common.

9. The component according to claim 8, comprising a plurality of resistive regions, each of which extends between a respective pair of consecutive first type semiconductor regions.

10. An integrated power device having a control terminal and a high-voltage terminal and comprising a high-voltage sensor connected to said control terminal and to said high-voltage terminal; wherein said voltage sensor comprises a junction electronic component, comprising:
    at least a first type semiconductor region and a second type semiconductor region, which have a first and, respectively, a second type of conductivity, opposite to the first type of conductivity and are arranged contiguous to one another so as to form a PN junction;
    wherein the junction electronic component has a first surface, a second surface opposite to said first surface, and a thickness, and wherein said first type semiconductor region and said second type semiconductor region extend between said first surface and said second surface and said PN junction extends across the whole thickness of the junction electronic component;
    a first biasing contact region contacting the first type semiconductor region and adapted to receive a biasing voltage to be applied to the first type semiconductor region;
    a second biasing region contacting the second type semiconductor region and adapted to receive a second biasing voltage to be applied to the second type semiconductor region;
    wherein the junction electronic further comprises at least one resistive region, which has said first type of conductivity and extends from said first type semiconductor region contiguous to said second type semiconductor region so as to form a resistive path between said first and second biasing regions in parallel to said PN junction.

11. The device according to claim 10, wherein the device comprises an active region and in that said high-voltage sensor is separated from said active region by means of a layer of dielectric material.

12. A junction electronic component, comprising:
    a first semiconductor region having a first conductivity type and a second semiconductor region having a second conductivity type, the first and second semiconductor regions being arranged to form a PN junction between the first and second contact regions;
    wherein the junction electronic component has a first surface, a second surface opposite to said first surface, and a thickness, and wherein said first semiconductor region and said second semiconductor region extend between said first surface and said second surface and said PN junction extends across the whole thickness of the junction component;
a first contact region contacting the first semiconductor region;
a second contact region contacting the second semiconductor region; and
a resistive region in the first semiconductor region that forms a resistive path between the first and second contact regions in parallel with the PN junction.

13. The junction electronic component of claim 12 wherein first contact region is formed in the first semiconductor region, the second contact region is formed in the second semiconductor region, and wherein the resistive region is formed by a projection of the first semiconductor region extending through the second semiconductor region to contact the second contact region.

14. The junction electronic component of claim 12 wherein,
the first semiconductor region has first, second, third, and fourth edges,
the first contact region is formed towards the first edge of the first semiconductor region and the second contact region is formed towards the second edge of the first semiconductor region, the second edge being opposite the first edge,
the second semiconductor region comprises a first portion formed adjacent the third edge of the first semiconductor region and positioned between the first and second contact regions, and
the second semiconductor region further comprises a second portion formed adjacent the fourth edge of the first semiconductor region and positioned across from the first portion between the first and second contact regions, the fourth edge being opposite the third edge and a portion of the first semiconductor region between the first and second portions forming the resistive region.

15. The junction electronic component of claim 12 wherein,
the first semiconductor region has first, second, third, and fourth edges,
the first contact region is formed towards the first edge of the first semiconductor region and the second contact region is formed towards the second edge of the first semiconductor region, the second edge being opposite the first edge,
the second semiconductor region comprises a plurality of first projections extending from the third edge of the first semiconductor region towards a center of the first semiconductor region,
the second semiconductor region further comprises a plurality of second projections extending from the fourth edge of the first semiconductor region towards the center of the first semiconductor region, each second portion being formed across from a respective first portion, and
wherein a portion of the first semiconductor region between the first and second projections forms the resistive region.

16. The junction electronic component of claim 12 wherein,
the first semiconductor region has first, second, third, and fourth edges,
the first contact region is formed towards the first edge of the first semiconductor region and the second contact region is formed towards the second edge of the first semiconductor region, the second edge being opposite the first edge,
the second semiconductor region comprises a plurality of first projections extending from the third edge of the first semiconductor region towards the fourth edge, each first projection having an end adjacent the fourth edge of the first semiconductor region,
the second semiconductor region further comprises a plurality of second projections extending from the fourth edge of the first semiconductor region towards the third edge, each second projection having an end adjacent the third edge of the first semiconductor region and extending between adjacent first projections, and
wherein a serpentine portion of the first semiconductor region between the first and second projections forms the resistive region.

17. The junction electronic component of claim 12 wherein the first semiconductor region comprises a P-type semiconductor and wherein the second semiconductor region comprises an N-type semiconductor.

18. A power device, comprising:
a collector region having a first conductivity type;
conductive region formed adjacent the collector region and having a second conductivity type;
at least one body region formed in the conductive region, each body region having the first conductivity type;
at least one emitter region formed in each body region, each emitter region having the second conductivity type;
at least one gate region formed over the body regions;
an equipotential region formed adjoining the conductive region; and
a junction electronic component that is electrically isolated from the conductive region and being coupled between each gate region and the equipotential region, the junction electronic component having a thickness and comprising at least one PN junction extending the thickness of the component, and the component further including a resistive region in parallel with the PN junction.

19. The power device of claim 18 wherein the junction electronic component comprises:
a first contact region coupled to each of the gate regions,
a second contact region coupled to the equipotential region,
a first semiconductor region having a first conductivity type and a second semiconductor region having a second conductivity type, the first and second semiconductor regions being arranged to form the PN junction between the first and second contact regions; and
a resistive region in the first semiconductor region to form a resistive path between the first and second contact regions in parallel with the PN junction.

20. The power device of claim 19 wherein first contact region is formed in the first semiconductor region, the second contact region is formed in the second semiconductor region, and wherein the resistive region is formed by a projection of the first semiconductor region extending through the second semiconductor region to contact the second contact region.

21. The power device of claim 19 wherein,
the first semiconductor region has first, second, third, and fourth edges,
the first contact region is formed towards the first edge of the first semiconductor region and the second contact region is formed towards the second edge of the first semiconductor region, the second edge being opposite the first edge, the second semiconductor region comprises a first portion formed adjacent the third edge of the first semiconductor region and positioned between the first and second contact regions, and the second semiconductor region further comprises a second portion formed adjacent the fourth edge of the first semiconductor region and positioned across from the first portion between the first and second contact regions, the fourth edge being opposite the third edge and a portion of the first semiconductor region between the first and second portions forming the resistive region.

22. The power device of claim 19 wherein, the first semiconductor region has first, second, third, and fourth edges, the first contact region is formed towards the first edge of the first semiconductor region and the second contact region is formed towards the second edge of the first semiconductor region, the second edge being opposite the first edge, the second semiconductor region comprises a plurality of first projections extending from the third edge of the first semiconductor region towards a center of the first semiconductor region, the second semiconductor region further comprises a plurality of second projections extending from the fourth edge of the first semiconductor region towards the center of the first semiconductor region, each second portion being formed across from a respective first portion, and wherein a portion of the first semiconductor region between the first and second projections forms the resistive region.

23. The power device of claim 19 wherein, the first semiconductor region has first, second, third, and fourth edges, the first contact region is formed towards the first edge of the first semiconductor region and the second contact region is formed towards the second edge of the first semiconductor region, the second edge being opposite the first edge, the second semiconductor region comprises a plurality of first projections extending from the third edge of the first semiconductor region towards the fourth edge, each first projection having an end adjacent the fourth edge of the first semiconductor region, the second semiconductor region further comprises a plurality of second projections extending from the fourth edge of the first semiconductor region towards the third edge, each second projection having an end adjacent the third edge of the first semiconductor region and extending between adjacent first projections, and wherein a serpentine portion of the first semiconductor region between the first and second projections forms the resistive region.

24. The power device of claim 18 wherein the power device comprises an IGBT.

25. An electronic system including a power device, the power device including, a collector region having a first conductivity type;

conductive region formed adjacent the collection region and having a second conductivity type;

at least one body region formed in the conductive region, each body region having the first conductivity type;

at least one emitter region formed in each body region, each emitter region having the second conductivity type;

at least one gate region formed over the body regions;

an equipotential region formed adjoining the conductive region; and a junction electronic component that is electrically isolated from the conductive region and being coupled between each gate region and the equipotential region, the junction electronic component having a thickness and comprising at least one PN junction extending the thickness of the component, and the component further including a resistive region in parallel with the PN junction.

26. The electronic system of claim 25 wherein the system comprises and electronic ignition system.

* * * * *